United States Patent [19]

White et al.

[11] Patent Number: 4,937,175

[45] Date of Patent: Jun. 26, 1990

[54] FREE RADICALLY INITIATED PROCESS

[75] Inventors: Jerry E. White; Richard A. Wolf, both of Midland, Mich.

[73] Assignee: The Dow Chemical Company, Midland, Mich.

[21] Appl. No.: 299,201

[22] Filed: Jan. 23, 1989

[51] Int. Cl.$^5$ .......................... G03C 1/68; G03F 7/00
[52] U.S. Cl. ..................................... 430/300; 430/171;
430/919; 522/62; 525/332.7; 525/376;
526/218.1
[58] Field of Search ............... 525/376, 332.7; 522/62;
526/218.1; 430/300, 171, 919

[56] References Cited

U.S. PATENT DOCUMENTS

| | | | |
|---|---|---|---|
| 3,755,289 | 8/1973 | Nagaoka et al. | 522/62 |
| 3,956,269 | 5/1976 | Sheppard et al. | 525/376 |
| 4,069,377 | 1/1978 | MacLeay et al. | 526/218 |
| 4,094,756 | 6/1978 | Taylor | 522/62 |
| 4,228,232 | 10/1980 | Rousseau | 430/271 |
| 4,255,536 | 3/1981 | Udipi | 525/31 X |
| 4,507,382 | 3/1985 | Rousseau | 430/275 |
| 4,604,455 | 8/1986 | MacLeay | 53/587 X |
| 4,820,619 | 4/1989 | Sanada et al. | 430/197 |

*Primary Examiner*—Paul R. Michl
*Assistant Examiner*—Christopher D. RoDee
*Attorney, Agent, or Firm*—Douglas N. Deline

[57] ABSTRACT

Compositions comprising a free radical sensitive compound and a thermally stable substituted diazene which upon exposure to electromagnetic radiation is convertible to a thermally unstable substituted diazene may be formed and processed utilizing thermally intense techniques and thereafter the free radically initiated changes initiated by exposing the substituted diazene to light and heat.

20 Claims, No Drawings

FREE RADICALLY INITIATED PROCESS

BACKGROUND OF THE INVENTION

The present invention relates to a novel technique for initiating free radical processes. Numerous chemical processes of great commercial importance are initiated by the use of free radical initiators. Examples of such chemical phenomena include oxidation, photolysis, and polymerization processes wherein free radicals act either as initiators or intermediates therein. A particularly highly useful free radically initiated process is the polymerization of monomers containing ethylenic unsaturation. Examples include the free radically initiated polymerization of vinyl containing monomers such as styrene, methylmethacrylate, etc. as well as dienes particularly conjugated dienes such as butadiene or isoprene and crosslinking reactions involving the free radically initiated polymerization of a polymeric component containing ethylenic unsaturation optionally in the presence of a coreactant.

Previously known free radical initiators have not been thermally stable. Upon incorporation of the free radical generator with the free radical sensitive compound the desired reaction would be initiated. While to a certain extent control of the process could be obtained by cooling the resulting mixture, there is no known technique for the delayed initiation of free radical processes.

In certain applications it would be desirable to provide a free radical sensitive compound which may be formulated into a resulting product or merely retained in a shelf stable condition until later when upon the occurrence of a suitable activating event the desired chemical reaction is allowed to take place.

In particular it would be desirable to provide a crosslinkable polymeric composition which is thermally stable and may be processed under normal melt extrusion or other processing conditions but may at a later time upon the occurrence of a suitable activating event be crosslinked through free radical initiated polymerization.

In Canadian Patent No. 738,500; an ethylene bismaleimide and an N,N'-meta phenylene bismaleimide are disclosed for use as vulcanizing agents in the crosslinking of various unsaturated rubbers including homopolymers and heteropolymers of conjugated dienes, e.g., polybutadiene and butadiene/styrene copolymers, and polyurethane rubbers. Such vulcanizing agents were thermally activated.

In U.S. Pat. No. 3,674,486, photoresist materials comprising a photosensitizer, a crosslinking agent and a rubber-like constituent are disclosed. Suitable crosslinking agents disclosed included multifunctional olefins, such as triallyl cyanurate, pentaerthritol triacrylate, and polyvinyl cinnamate.

In U.S. Pat. Nos. 4,079,041, 4,163,097, 4,158,730 and 4,158,731 there are disclosed certain organic polymers which can be crosslinked under the action of light having a molecular weight of at least 1,000 and containing as light sensitive groups di-substituted maleimide functionality.

In U.S. Pat. No. 2,925,407, the curing of high molecular weight substantially unsaturated polymers by the use of free-radical generators such as organic peroxide and free-radical exceptors such as bismaleimide compounds, among others, is disclosed. Such a curing operation is thermally activated.

The teachings of the above publications are incorporated in their entirety by reference thereto.

Despite advances in the art utilizing photolytically active curing agents, there remains a desire to prepare compositions that may be readily crosslinked but are insensitive to curing prematurely under the action of heat. Compositions which are not thermally stable cannot easily be employed in thermal processing operations such as melt extrusion, extrusion coating, melt mixing and other high temperature processes. Alternative techniques such as solvent deposition or other suitable technique must be employed to manufacture and apply thermally sensitive compositions. However, solvents are both expensive and undesirable from the standpoint of atmospheric emissions and combustion hazard. Moreover, thermally unstable compositions and materials prepared therefrom must be subsequently treated in a manner so as to minimize the effects of thermal crosslinking. For example, flexible or flexographic printing plates that are subject to thermal crosslinking should be maintained at reduced temperatures in order to impart practical lifetimes. The need for refrigeration of such materials has limited the extent to which they have been commercially exploited.

Summary of the Invention

According to the present invention there is provided a composition comprising at least one free radical sensitive compound and a free radical generating quantity of a thermally stable substituted diazene corresponding to the formula:

$$R-N=N-R' \qquad \text{I}$$

wherein R and R' are organic radicals of up to 24 carbons and further wherein the diazene is convertible upon exposure to electromagnetic radiation into an isomer which upon exposure to heat forms free radicals in the composition.

Detailed Description of the Invention

Suitable free radically initiated processes wherein the present invention finds utility particularly include polymerization of preferred processes include polymerization of compositions containing ethylenic unsaturation. A most highly preferred process is the crosslinking of a composition comprising a crosslinkable polymer and optionally a coreactant. Examples of suitable compositions containing ethylenic unsaturation that may be polymerized by means of free radical initiators, include vinyl substituted compounds such as styrene, methylmethacrylate, acrylonitrile, etc.; dienes such as conjugated dienes especially butadiene and isoprene and homopolymers and interpolymers of one or more olefinic or diolefinic monomers containing residual ethylenic unsaturation. Examples of the latter include the well known polybutadiene and polyisoprene homopolymers as well as copolymers thereof with polymerizable comonomers. Especially preferred are block or random copolymers of such conjugated dienes with one or more copolymerizable monovinylidene aromatic monomers. Specific examples include the well known block copolymers of butadiene or isoprene with styrene or mixtures of styrene and α-methylstyrene.

In addition to the above polymeric components of the free radically initiatable mixture there may be included additional components designed for specific product properties. For example adhesive compositions may include a suitable low molecular weight polymeric component designed to improve initial tack or stickiness of the composition. Such tackifier resins may be incorporated in amounts from about 1 to 100 percent based on crosslinkable polymer content in order to provide desired adhesive tackiness. Examples include the well known hydrogenated terpene resins, low molecular weight styrene/butadiene copolymers, polypiperylene etc.

Thermally stable substituted diazenes particularly suitable for use according to the present invention include compositions which, in one isomeric form, have a half life to free radical decomposition at 200° C. in the absence of light or other electromagnetic radiation of at least 24 hours, preferably 100 hours, and most preferably 1000 hours. In addition such diazene compositions preferably have a half life to free radical decomposition in a second isomeric form, convertible from the first isomeric form by exposure to electromagnetic radiation, at 100° C., of less than or equal to 10 minutes. Preferably the half life of this isomeric form at 100° C. is less than or equal to one minute and most preferably less than or equal to 30 seconds. As a final requirement it is most desirable that the diazene free radical generating component be soluble in the composition in which it is desired to induce free radical initiated chemical processes or capable of being solubilized therein by addition of a compatibilizing agent.

In most cases the diazene initially is in the trans form when incorporated with the free radically sensitive compound. Upon exposure to electromagnetic radiation the diazene is converted to the thermally unstable cis form. Heating of the composition according to the present invention may be conducted concurrently or simultaneously with the generation of the thermally sensitive isomeric form by exposure to radiation, or may be delayed until a later time.

Preferred diazene compounds usefully employed according to the present invention are those corresponding to the previously disclosed Formula I wherein R is a phenyl group, an alkyl substituted phenyl group having up to 4 $C_{1-8}$ alkyl groups, or a ring halo substituted phenyl group and R' is an $\alpha$-alkoxy substituted alkyl group. Most preferably R is phenyl and R' is 2-methoxy-2-propyl. Accordingly, in a preferred embodiment, the thermally stable substituted diazene employed according to the present invention is.

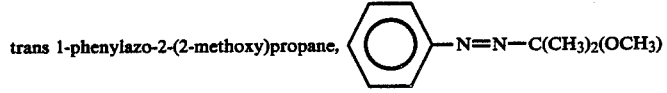

trans 1-phenylazo-2-(2-methoxy)propane, $\langle O \rangle$—N=N—C(CH$_3$)$_2$(OCH$_3$)

The thermally stable substituted diazenes employed according to the present invention may be suitably rendered active for the generation of free radicals by exposure to electromagnetic radiation of any suitable wavelength. It is generally desirable that such compounds be activated by the use of electromagnetic radiation of a wavelength of between about 180 and about 1000 nanometers. Other suitable activating electromagnetic radiation may include x-ray, or gamma radiation.

Thermally stable compositions according to the present invention comprising one of the previously mentioned crosslinkable thermoplastic elastomers preferably retain the practical ability to suitably flow under melt processing conditions after exposure to a temperature of 200° C. for at least 10 minutes. Practically such flow should be at least about a melt flow rate of 1.0 as measured by the American Society of Testing Materials (ASTM) method D1238 schedule G.

The preferred amount of the thermally stable substituted diazene employed in the present compositions is from about 0.001 percent to about 10 percent by weight based on total composition weight.

In the embodiment of the present invention specifically adapted to the preparation of a composition useful as a printing mat, a suitable rubbery polymeric material which is crosslinkable by exposure to free radical initiators is combined with the thermally stable substituted diazene isomer and coated, extruded or otherwise formed to a thin sheet optionally in combination with a suitable substrate or backing material such as a polymeric, cellulosic or metallic substrate. A desired selective exposure to electromagnetic radiation may be obtained by any suitable technique such as blocking of an area with a photomask or negative, the use of laser imaging or other suitable technique. The exposed composition is thereafter heated for a time sufficient to cause sufficient crosslinking to occur. Thereafter by solvent etching the unexposed portions of the printing plate are removed.

Having described the invention the following examples are provided as further illustrative and are not to be construed as limiting.

Example 1

Trans 1-phenylazo-2-(2-methoxy)propane (0.6 g), prepared according to the procedure of *Tetrahedron Letters*, 3785 (1970), and 30 g of a styrene-isoprenestyrene triblock copolymer (Kraton ® 1107 available from Shell Chemical), were taken up in methylene chloride. The solvent was removed in vacuo, and melt flow rates of the resulting blend kept for 5–60 min at 200° C. were determined according to ASTM Method D1238, schedule G. Results were as follows:

| Time at 200° C., min. | Melt flow rate, g/10 min. |
|---|---|
| 5 | 21.66 |
| 10 | 20.23 |
| 20 | 17.58 |
| 40 | 15.89 |
| 60 | 12.75 |

The results of this test indicate that in the trans isomeric form, 1-phenylazo-2-(2-methoxy)propane is thermally stable and the composition resulting from the blending of this compound with the above block copolymer is also thermally stable.

Films 1.5 mils, 0.3 mm thick of the above composition were cast from chloroform onto glass microscope slides. After evaporation of the solvent (24 hr. at 25° C.), the specimens were placed on a hot plate, maintained at 120° C., and covered with an enclosure (equipped with a quartz window), through which a stream of nitrogen was allowed to flow. The entire assembly was adjusted so that the samples could be irradiated at the focal point of a Porta Cure® 1500F UV source, equipped with a NO. PC - 1521 bulb. After photolysis, the specimens were allowed to cool to room temperature, and the cured resins were removed from the glass slides. Gel (insoluble) fractions were determined after extraction of the resins with methylene chloride for 24 hr at ca. 25° C. Results were as follows:

| Irradiation time, sec | Gel fraction, % |
|---|---|
| 1 | 5.9 |
| 4 | 36.4 |
| 6 | 36.4 |
| 20 | 70.0 |
| 30 | 80.0 |
| 60 | 89.5 |

From these results it may be seen that after exposure to light the composition of the invention is not thermally stable but instead cures through generation of free radicals.

Specimens were prepared and irradiated substantially as previously described, except that no heat, other than that produced by the UV lamp, was applied. Gel fractions were again determined.

| Irradiation time, sec | Gel fraction, % |
|---|---|
| 5 | 5.9 |
| 10 | 5.6 |
| 20 | 28.6 |
| 30 | 47.6 |
| 40 | 76.5 |
| 60 | 65.0 |

This result indicates that crosslinking is thermally induced after the photochemical conversion of the diazene compound to a thermally unstable compound and that free radical formation may be delayed after generation of the thermally unstable cis isomer of 1-phenylazo-2-(2-methoxy)propane.

Example 2

Mixtures of styrene (10 g) and 1-phenylazo-2-(2-methoxy)propane (0.1 g) are placed in two glass vials. One vial is exposed to light from a mercury lamp for one minute while the other is kept in the dark. Both vials are then heated to 100° C. for 10 minutes. Results indicated substantially more polymerization of the sample exposed to light as indicated by a significantly reduced melt flow rate upon comparison of the resulting products.

What is claimed is:

1. A composition comprising at least one free radical sensitive compound and a free radical generating quantity of a thermally stable substituted diazene corresponding to the formula:

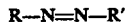

R—N=N—R' wherein R is an organic radical of up to 24 carbons, R' is an α-alkoxy substituted alkyl group and further wherein the diazene is convertible upon exposure to electromagnetic radiation into an isomer which upon exposure to heat forms free radicals in the composition.

2. A composition according to claim 1 wherein R is phenyl, ring alkyl substituted phenyl containing up to 4 $C_{1-8}$ alkyl groups, or ring halogenated phenyl.

3. A composition according to claim 1 wherein R is phenyl and R' is 2-methoxy-2-propyl.

4. A composition according to claim 1 wherein the free radical sensitive compound is a composition containing ethylenic unsaturation.

5. A composition according to claim 1 wherein the free radical sensitive compound is a block copolymer of monovinylidene aromatic monomer and a conjugated diene.

6. A composition according to claim 5 wherein the block copolymer is a block copolymer of styrene and isoprene.

7. A composition according to claim 1 which is an adhesive composition.

8. A composition according to claim 1 which is formed into a thin sheet for use as a photoactivatable printing plate.

9. A method for the free radical initiation of an oxidation, photolysis or polymerization process comprising:
   (a) forming a mixture of a compound sensitive to free radical induced oxidation, photolysis or polymerization and a free radical generating quantity of a thermally stable substituted diazene corresponding to the formula:

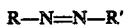

R—N=N—R' wherein R is an organic radical of up to 24 carbons, R' is an α-alkoxy substituted alkyl group and further wherein the diazene is convertible upon exposure to electromagnetic radiation into an isomer which upon exposure to heat forms free radicals in the composition;
   (b) exposing the mixture to electromagnetic radiation sufficient to convert the diazene to an isomer that upon exposure to heat forms free radicals; and
   (c) heating the mixture so as to initiate the process.

10. A method according to claim 9 which is a polymerization process.

11. A method to claim 9 wherein R is phenyl, ring alkyl substituted phenyl containing up to 4 $C_{1-8}$ alkyl groups or ring halo substituted phenyl.

12. A method according to claim 9 wherein the diazene is 1-phenylazo-2-(2-methoxy)propane.

13. A method according to claim 9 wherein the free radical sensitive compound is a composition containing ethylenic unsaturation.

14. A polymerization method according to claim 10 wherein the free radical sensitive compound is a composition containing vinyl unsaturation, a diene or a homopolymer or copolymer of a conjugated diene containing residual ethylenic unsaturation.

15. A method according to claim 13 wherein the free radical sensitive compound is a block copolymer of a vinyl aromatic monomer and a diene.

16. A process for crosslinking a composition comprising at least one crosslinkable polymer and a crosslinkable quantity of a thermally stable substituted diazine corresponding to the formula:

R—N=N—R' wherein R is an organic radical of up to 24 carbons, and R' is an α-alkoxy substituted alkyl group,
   the steps of the process comprising:

(1) exposing the composition to electromagnetic radiation suitable to convert the substituted diazene to an isomer that upon exposure to heat forms crosslink initiators in the composition; and (2) heating the composition to form crosslinks therein.

17. A process according to claim 16 wherein the crosslinkable polymer is a block copolymer of a monovinylidene aromatic monomer and a diene.

18. A process according to claim 16 wherein the crosslinkable polymer is a block of styrene and isoprene.

19. A process according to claim 16 wherein R is phenyl, a ring alkyl substituted phenyl having up to 4 $C_{1-8}$ alkyl groups, or ring halogenated phenyl.

20. A process according to claim 16 wherein the diazene is 1-phenylazo-2-(2-methoxy)propane.

* * * * *